United States Patent [19]
Lee

[11] Patent Number: 5,900,337
[45] Date of Patent: May 4, 1999

[54] PHASE SHIFT MASK AND METHOD FOR FABRICATING THE SAME

[75] Inventor: Jun Seok Lee, Seoul, Rep. of Korea

[73] Assignee: LG Semicon Co., Ltd., Cheongju, Rep. of Korea

[21] Appl. No.: 08/881,829

[22] Filed: Jun. 24, 1997

[30] Foreign Application Priority Data

Jun. 27, 1996 [KR] Rep. of Korea ........................ 96-24699

[51] Int. Cl.⁶ ........................................................ G03F 9/00
[52] U.S. Cl. ........................................................... 430/5
[58] Field of Search .............................. 430/5, 322, 323, 430/311, 313, 314

[56] References Cited

U.S. PATENT DOCUMENTS

| | | | |
|---|---|---|---|
| 5,300,379 | 4/1994 | Dao et al. | 430/5 |
| 5,302,477 | 4/1994 | Dao et al. | 430/5 |
| 5,460,908 | 10/1995 | Reinberg | 430/5 |
| 5,472,812 | 12/1995 | Sekine | 430/5 |

FOREIGN PATENT DOCUMENTS 6-90504  11/1994  Japan .

OTHER PUBLICATIONS

Marc D. Levenson et al., "Improving Resolution in Photolithography with a Phase–Shifting Mask," *IEEE Transactions on Electron Devices*, vol. ED29., No. 12, Dec. 1982.

Tsuneo Terasawa et al., "0.3–Micron Optical Lithography Using a Phase–Shifting Mask," SPIE, vol.1088, *Optical/Laser Microlithography 11* (1989), pp. 25–26.

*Primary Examiner*—S. Rosasco
*Attorney, Agent, or Firm*—Fleshner & Kim

[57] ABSTRACT

The phase shift mask and a method for fabricating the phase shift mask of the present invention improve a light intensity in a densely packed pattern. The phase shift mask has a light shielding layer with a plurality of light transmissive regions formed therein, including an etch stopper layer with first light transmissive patterns and second light transmissive patterns formed alternately thereon. Each of the first light transmissive patterns has one of the light transmissive regions and a first phase shift layer formed between the rims of one of the light transmissive regions, and each of the second light transmissive patterns has a second phase shift layer formed on a central part of another one of the light transmissive regions.

40 Claims, 12 Drawing Sheets

PHASE SHIFT MASK AND METHOD FOR FABRICATING THE SAME

BACKGROUND OF THE INVENTION

1. Field of the Invention

The present invention relates to a semiconductor mask, and more particularly, to a phase shift mask and a method for fabricating the phase shift mask.

2. Background of the Related Art

A photomask having a part for transmitting light and another other part for shielding light is generally used in photolithography, which is used for fabricating a semiconductor device. However, the related art photomask, which has a light transmission pattern and a light shielding pattern for selective exposure, has a limited resolution because of diffraction. To decrease the diffraction, the phase shift mask combines a light transmissive region, which transmits it, and a light shifting transmissive region, which transmits a light shifted by 180 degrees.

FIGS. 1a–1d illustrate sections showing one example of the steps of a related art method for fabricating a phase shift mask. Referring to FIG. 1a, a light shielding layer 2 and a photoresist 3 are successively formed on a light transmissive substrate 1. The photoresist 3 is subjected to exposure and development to define regions in which first and second light transmissive regions are to be formed and to pattern the photoresist 3 to form first and second photoresist holes H1 and H2 therein. The first photoresist holes H1 are used to form the first light transmissive regions and the second photoresist holes H2 are used to form the second light transmissive regions.

Referring to FIG. 1b, the patterned photoresist 3 is used as a mask in etching the light shielding layer 2 and the light transmissive substrate 1 to a predetermined depth to form a first light transmissive region 4 and second light transmissive regions 5. Then, the photoresist 3 is removed. The etching depth of the substrate 1 is predetermined so that a phase of light passing therethrough is shifted by 160–200 degrees compared to a phase of light which passes through the light transmissive substrate 1. The first light transmissive region 4 is a light transmissive region that actually patterns a photoresist, and the second light transmissive regions 5 are light transmissive regions that do not actually pattern the photoresist. The light passing through the two kinds of regions are shifted by 160–200 degrees each in phase.

Referring to FIG. 1c, on an entire resultant surface, a photoresist 6 is deposited and patterned to selectively remove the photoresist 6 on both sides of the first light transmissive region 4. At the same time, the photoresist 6 between the second light transmissive regions 5 is also removed. Each of the removed widths of the photoresist 6 on both sides of the first light transmissive region 4 and the second light transmissive region 5 is the same.

Referring to FIG. 1d, the photoresist 6 is used as a mask in a selective etching of the light shielding layer 2 to form a third light transmissive region 6 and fourth light transmissive regions 7. The third light transmissive region 6 is a light transmissive region that actually carries out patterning of a photoresist, and the fourth light transmissive regions 7 are light transmissive regions that do not actually carry out patterning of the photoresist.

The related art phase shift mask includes a first light transmissive pattern 8 which includes a first light transmissive region 4, which is a main light transmissive region, and the fourth light transmissive regions 7, which are supplementary light transmissive regions. The shifting of a phase of light passing through the fourth light transmissive regions 7 of the supplementary regions opposite to a phase of light passing through the first light transmissive region 4 of the main light transmissive region prevents an intensity of light passing through the main light transmissive region from becoming gentle by a side lobe at a boundary, resulting in a steep slope of the light intensity, thereby allowing formation of an accurate desired pattern.

A second light transmissive pattern 9 adjacent to the first light transmissive pattern 8 includes the third light transmissive region 6, which is a main light transmissive region, and second light transmissive regions 5, which are supplementary light transmissive regions. The operation of the second light transmissive pattern is identical to the first light transmissive pattern. However, as the major phases of the second light transmissive pattern 9 and the first light transmissive pattern 8 are opposite to the other, their side lobes at an overlapped portion d1 are canceled by the other, thereby preventing the formation of an anomalous pattern.

FIGS. 2a–2f illustrate sections showing a second example of the steps of a related art phase shift mask. Referring to FIG. 2a, a light shielding layer 11 and a first photoresist 12 are successively formed on a light transmissive substrate 10 having light transmissive pattern regions $P_1$ and $P_2$ and a light shielding pattern region $P_3$ defined thereon. The $P_1$ region is a region in which a first light transmissive pattern is to be formed, the $P_2$ region is a region in which a second light transmissive pattern is to be formed, and the $P_3$ region is a region in which a light shielding pattern is to be formed.

Referring to FIG. 2b, the first photoresist 12 at the edges or rims of the first and second light transmissive pattern regions $P_1$ and $P_2$ are selectively patterned. The patterned first photoresist 12 is used as a mask to etch the light shielding layer 11 and the light transmissive substrate 10 to a predetermined depth for forming a plurality of light transmissive holes $H_{10}$.

Referring to FIG. 2c, the first photoresist 12 is removed. Then, on an entire resultant surface, a second photoresist 13 is deposited. The second photoresist 13 in the first and second light transmissive regions $P_1$ and $P_2$ is selectively patterned with exposure and development. The second photoresist 13 fully covers the light shielding layer 11 in the light shielding pattern region $P_3$, only to expose the light shielding layer 11 in the light transmissive pattern regions $P_1$ and $P_2$.

Referring to FIG. 2d, the second photoresist 13 is used as a mask to etch the exposed light shielding layer 11. Then, the second photoresist is also removed. By this, the first light transmissive regions 14, which are the main light transmissive regions, and second light transmissive regions 15, which are formed at the rims of the first light transmissive regions 14, are formed repeatedly on the light transmissive substrate 10 having the first and second light transmissive regions $P_1$ and $P_2$ defined thereon.

Referring to FIG. 2e, a third photoresist 16 is deposited on an entire resultant surface, and the third photoresist 16 in only one of the first and second light transmissive pattern regions $P_1$ and $P_2$, for example, the second light transmissive pattern region $P_2$ is selectively patterned.

Referring to FIG. 2f, the third photoresist 16 is used as a mask in simultaneously etching the first light transmissive region 14 and the second light transmissive regions 15 in the second light transmissive pattern region $P_2$ to predetermined depths to form a third light transmissive region 17, which is a main light transmissive region, and fourth light transmissive regions 18, which are supplementary regions.

The etching depths of the third light transmissive region 17 and the fourth light transmissive regions 18 are determined so as to shift phases of the light passed through the third light transmissive region 17 and the fourth light transmissive regions 18 by 160–200 degrees and 360 degrees, respectively, compared to the phase shiftings of light passing through of the first light transmissive region 14 and the second light transmissive regions 15 which are used as reference for 0 degrees and 180 degrees, respectively. Since the phases of lights of the first light transmissive pattern $P_1$ and the second light transmissive pattern $P_2$ are opposite to the other, their side lobes which can be formed at a location of the light shielding layer 11 pattern in an overlapped portion of the two light transmissive patterns $P_1$ and $P_2$ are canceled by the other, thereby preventing the formation of an anomalous pattern.

FIG. 3 illustrates a section showing a third example of the phase shift mask. A light shielding layer 22 has a plurality of first light transmissive regions 21 formed on a light transmissive substrate 20. The light shielding layers 24 are formed on the light shielding layer 22 on both sides of the second light transmissive region 23. The first light transmissive region 21, the second light transmissive region 23 and the light shielding layers 24 are repeatedly formed on the substrate 20. When a phase of the light passing through the first light transmissive region 21 has a 0 degree phase shift, the second light transmissive region 23 transmits the light of 180 degrees phase shift. Therefore, by using a phase shift mask having the first light transmissive region 21 and the second light transmissive region 23 alternately formed, formation of side lobes caused by diffraction of lights can be prevented.

The above phase shift masks and methods of making the masks have various disadvantages. The etching processes required for etching the light transmissive substrates in formation of the main light transmissive patterns and the supplementary patterns may damage the substrates, and it may be difficult to control their etching stop points. Further, the etching of a phase adjusting member of the light transmissive substrate to the maximum etching depth, i.e., depth to provide a 360 degree phase shift, causes a change in its light intensity, which degrades the reliability. The process in which a surface of the light transmissive substrate is exposed partially damages the substrate, which may cause phase errors.

The above references are incorporated by reference herein where appropriate for appropriate teachings of additional or alternative details, features and/or technical background.

SUMMARY OF THE INVENTION

Accordingly, the present invention is directed to a phase shift mask and a method for fabricating the phase shift mask that substantially obviates one or more of the problems due to limitations and disadvantages of the related art.

An object of the present invention is to provide a phase shift mask and a method for fabricating the phase shift mask which can be fabricated in self alignment without damaging the light transmissive substrate.

To achieve these and other advantages and in accordance with the purpose of the present invention, as embodied and broadly described, the phase shift mask, having a light shielding layer with a plurality of light transmissive regions formed therein, includes an etch stopper layer having first light transmissive patterns and second light transmissive patterns formed alternately thereon, each of the first light transmissive patterns having one of the light transmissive regions and a first phase shift layer formed at a rim of the one of the light transmissive regions, and each of the second light transmissive patterns having a second phase shift layer formed on a central part of another one of the light transmissive regions adjacent to the one of the first light transmissive regions.

In another aspect, the present invention provides a method for fabricating a phase shift mask including the steps of providing a light transmissive substrate, forming an etch stopper layer, a light shielding layer and an oxidation preventing layer on the light transmissive layer in succession, selective removal of the oxidation preventing layer and the light shielding layer for forming a plurality of first opening regions, partial oxidization of the light shielding layer at sides of each of the first opening regions to form first phase shift layers, thereby to form first light transmissive patterns each having the first opening region and the first phase shift layer, selective removal of the oxidation preventing layer and the light shielding layer between the first light transmissive patterns for forming light transmissive holes each of which uses a rim thereof as a second opening region and forming a second phase shift layer on a central part of each of the light transmissive holes to form second light transmissive patterns each having the second opening region and the second phase shift layer.

It is to be understood that both the foregoing general description and the following detailed description are exemplary and explanatory and are intended to provide further explanation of the invention as claimed. Additional features, objects and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

Figure 1A:
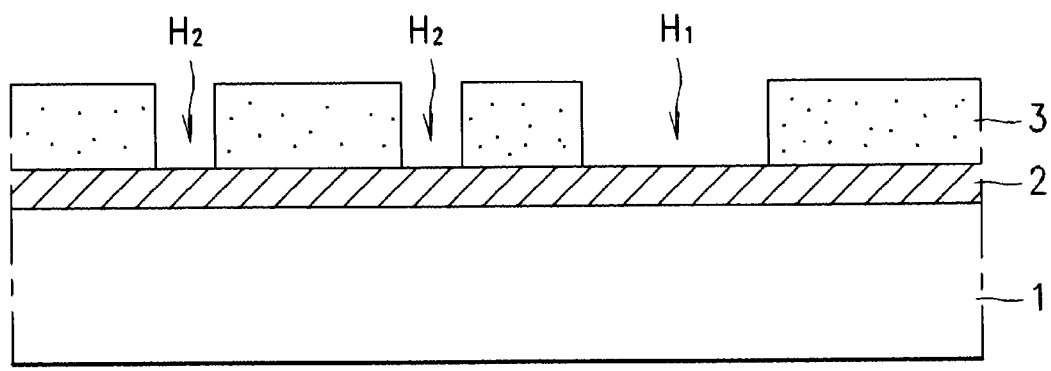
FIGS. 1a–1d illustrate sections showing one example of the steps of a related art method for fabricating a phase shift mask.
Figure 1B:
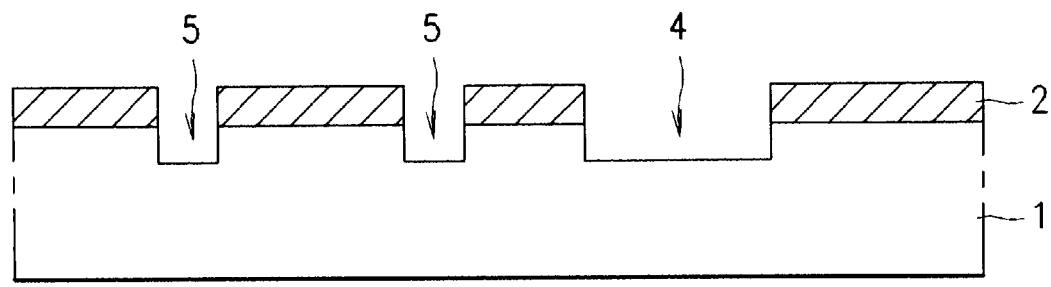
Figure 1C:
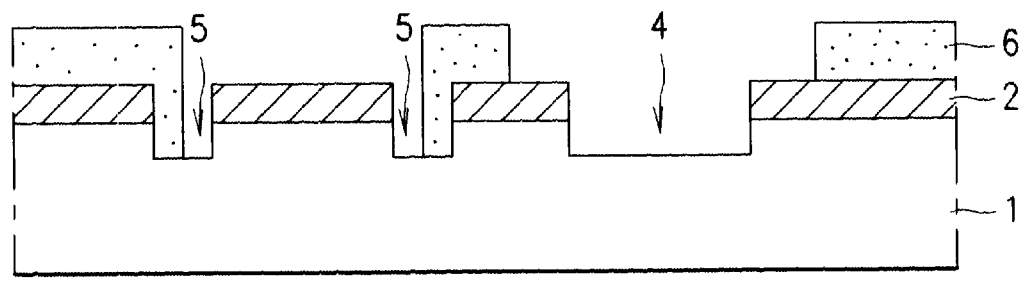
Figure 1D:
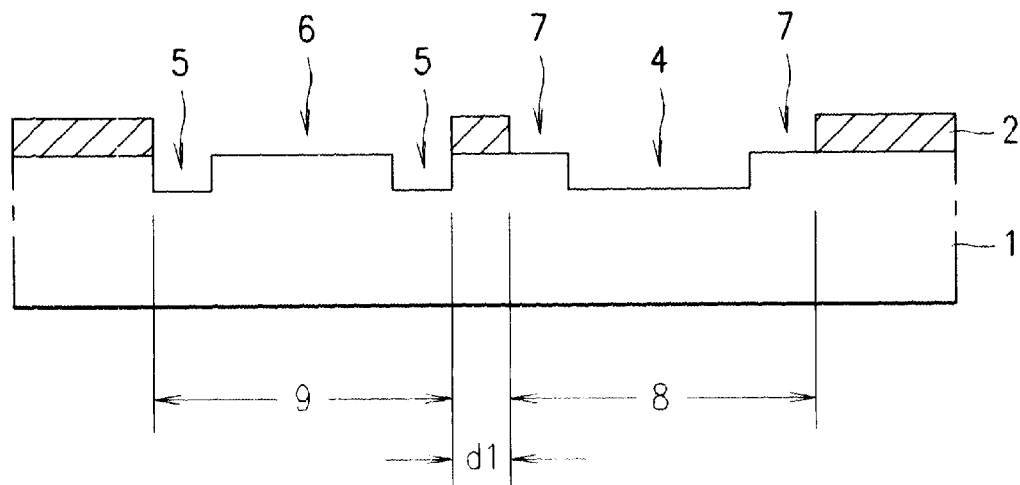
Figure 2A:
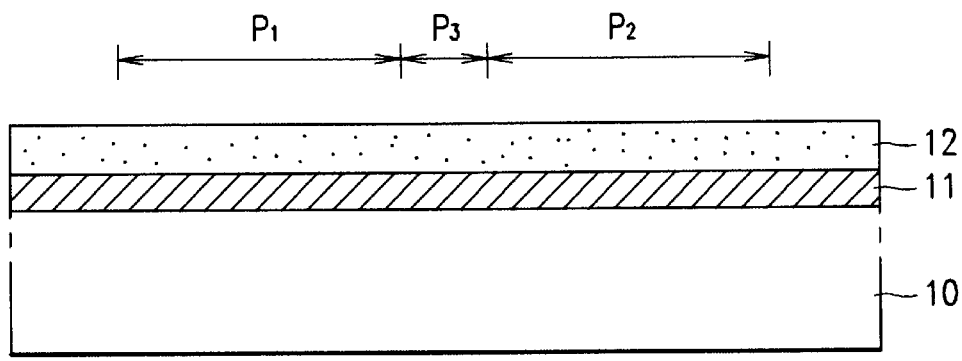
FIGS. 2a–2f illustrate sections showing a second example of the steps of a related art method for fabricating a phase shift mask.
Figure 2B:
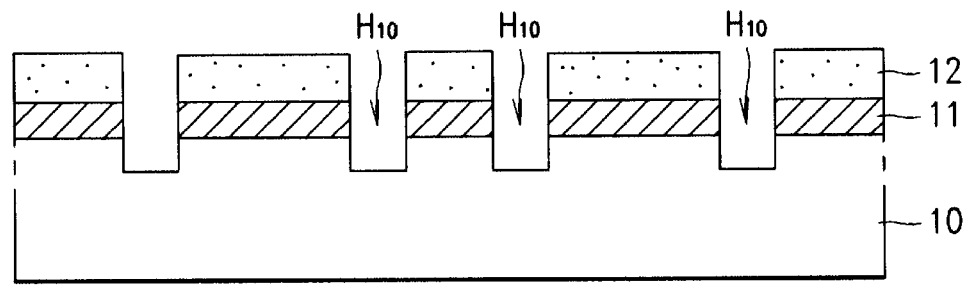
Figure 2C:
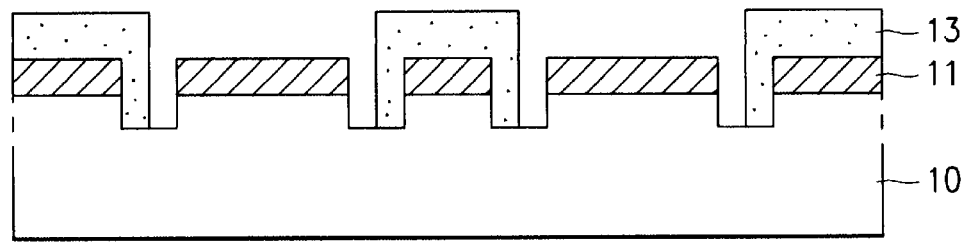
Figure 2D:
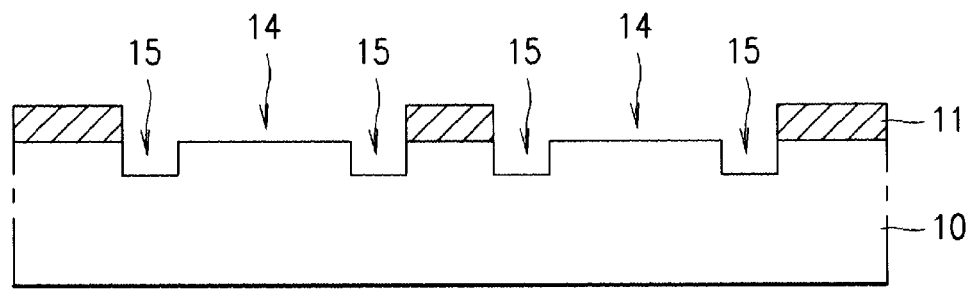
Figure 2E:
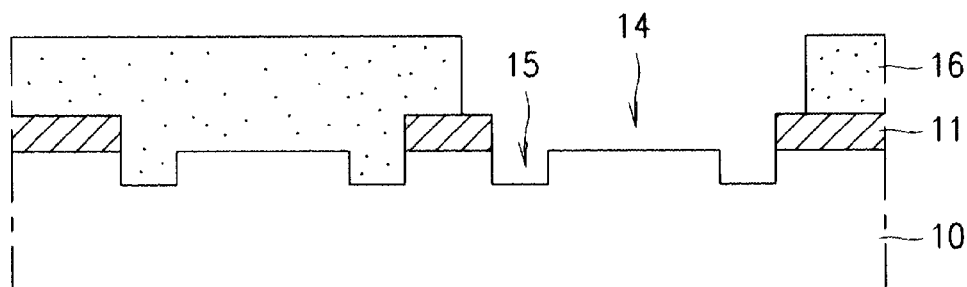
Figure 2F:
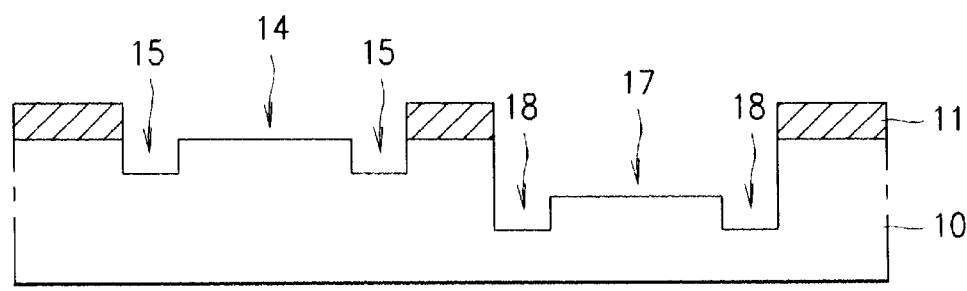
Figure 3:
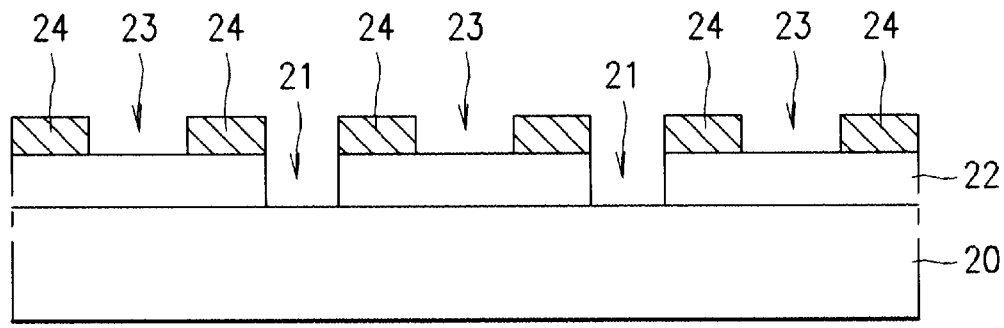
FIG. 3 illustrates a section showing a third example of a related art phase shift mask.
Figure 4:
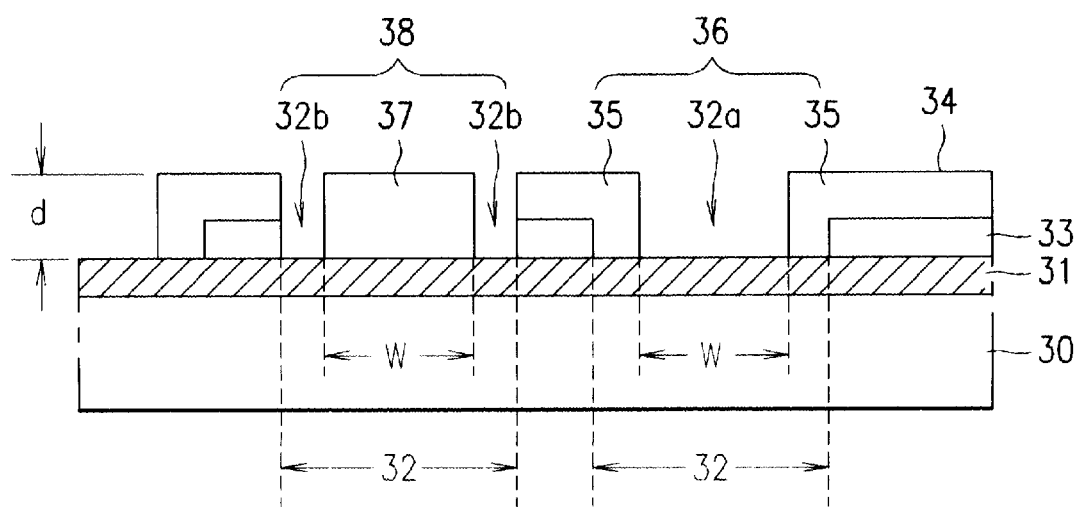
FIG. 4 illustrates a section of a phase shift mask in accordance with a preferred embodiment of the present invention.

FIG. 4 illustrates a section of a phase shift mask in accordance with a preferred embodiment of the present invention. On a light transmissive substrate 30, an etch stopper layer 31 is preferably formed on an entire surface of the light transmissive substrate 30. A light shielding layer 33 is formed on the etch stopper layer 31 and has a plurality of opening regions 32. An oxidation preventing layer 34 is formed on the light shielding layer 33. A first light transmissive pattern 36 includes one opening region 32a and a first phase shift layer 35 formed at a rim of the one opening region 32a. A second light transmissive pattern 38, having another opening region 32 adjacent to the first light transmissive pattern 36, includes and a second phase shift layer 37 formed on a central part of the another opening region 32, and a second opening region 32a formed around the second phase shift layer 37. The first and second light transmissive patterns 36 and 38 are alternately formed.

The light transmissive substrate 30 is preferably formed of glass or quartz, and the etch stopper layer 31 is formed of $SnO_2$. The light shielding layer 33 is preferably formed of a material that is thermally oxidizable such as polysilicon. The oxidation preventing layer 34 is formed of an oxide that is preferably transparent. A width of the second phase shift layer 37 is preferably formed to be about the same as a width w of the opening region 32a between the edges of the first phase shift layer 35. The first and second phase shift layers 35 and 37 are preferably formed of an oxide to have about the same thickness. The first phase shift layer 35 has preferably an oxide at one side of the light shielding layer 33 formed from the oxidation of the light shielding layer 33 and a portion in contact with the oxidation preventing layer 34.

The phase shift layers 35 and 37 have the following thickness d:

$$d = \frac{\lambda}{2(n-1)}$$

where $\lambda$ is a wavelength of light, and n is a light refractive index of the phase shift layers 35 and 37.

The opening region between the edges of the first phase shift layers 35 constitutes a first light transmissive region 32a, and the opening region between the second phase shift layer 37 and the light shielding layer 33 constitutes a second light transmissive 32b. The first phase shift layer 35 constitutes a fourth light transmissive region, and the second phase shift layer 37 constitutes a third light transmissive region.

Figure 5A:
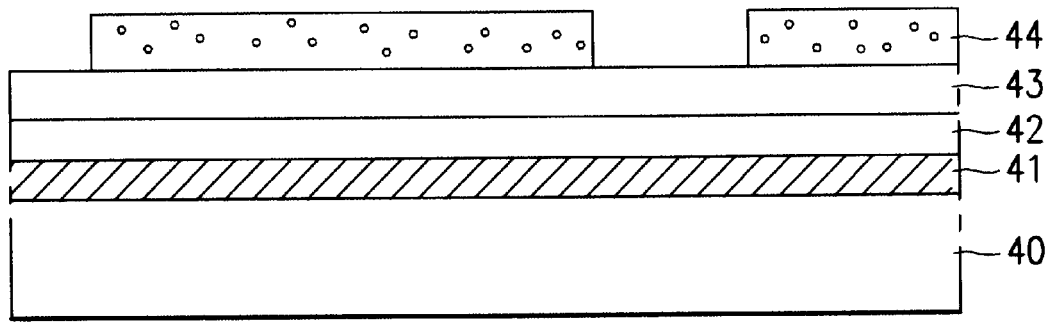
FIGS. 5a–5g illustrate sections showing the steps of a method for fabricating a phase shift mask in accordance with a preferred first embodiment of the present invention.

FIGS. 5a–5g illustrate the steps of a method for fabricating a phase shift mask in accordance with a first embodiment of the present invention. An etch stopper layer 41, a light shielding layer 42, an oxidation preventing layer 43 and a first photoresist 44 are preferably formed on a light transmissive substrate 40 in succession, as shown in FIG. 5a. A first photoresist 44 is patterned to define a first opening region. The light transmissive substrate 40 is formed of glass or quartz, and the etch stopper layer 41 is formed of $SnO_2$. The light shielding layer 42 is formed of a material that is thermally oxidizable and preferably containing Si, e.g., polysilicon. The oxidation preventing layer 43 is formed of a transparent oxide.

Figure 5B:
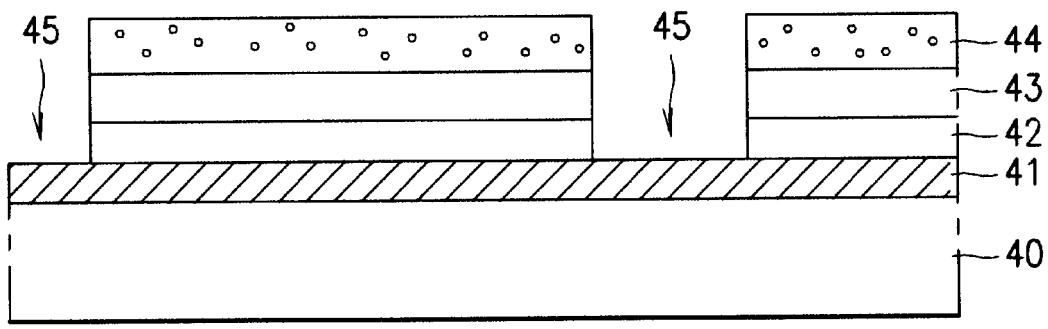
Figure 5C:
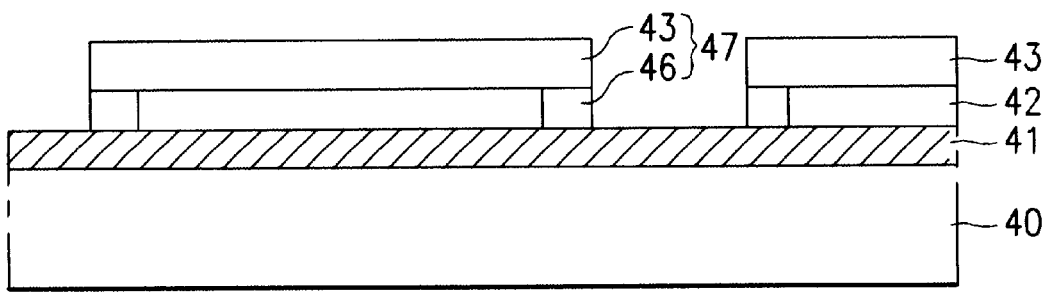

Referring to FIG. 5b, the patterned first photoresist 44 is used as a mask in selectively etching the oxidation preventing layer 43 and the light shielding layer 42 to form a first opening region 45. As shown in FIG. 5c, the first photoresist 44 is removed and the light shielding layer 42 exposed at sides of the first opening region 45 is thermally oxidized in an oxygen ambient. Then, a first phase shift layer 47, having the oxide 46 of the oxidized light shielding layer 42 and the oxidation preventing layer 43 on and in contact with the oxide 46 is formed in self alignment. The first opening region 45 is used as a first light transmissive pattern in combination with the first phase shift layer 47.

Figure 5D:
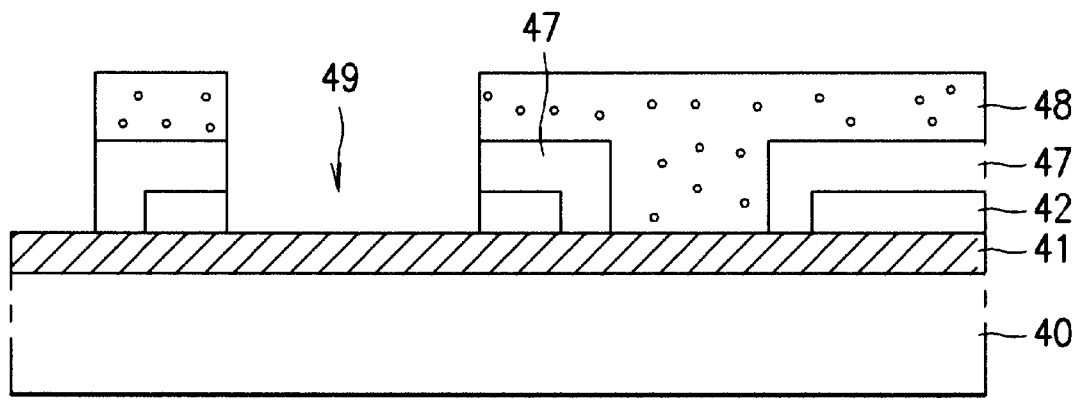

Referring to FIG. 5d, a second photoresist 48 is deposited on an entire resultant surface including the first opening region 45 and the oxidation preventing layer 43. A region in which a light transmissive hole is to be formed is defined between the first opening regions 45 and the second photoresist 48 is patterned. The patterned second photoresist 48 is used as a mask in etching the oxidation preventing layer 43 and the light shielding layer 42 in succession to form a light transmissive hole 49. A size of the light transmissive hole 49 is formed to be the same with the size of the first phase shift layer 47 including the first opening region 45. The rim of the light transmissive hole 49 defines the region to be used as a second opening region.

Figure 5E:
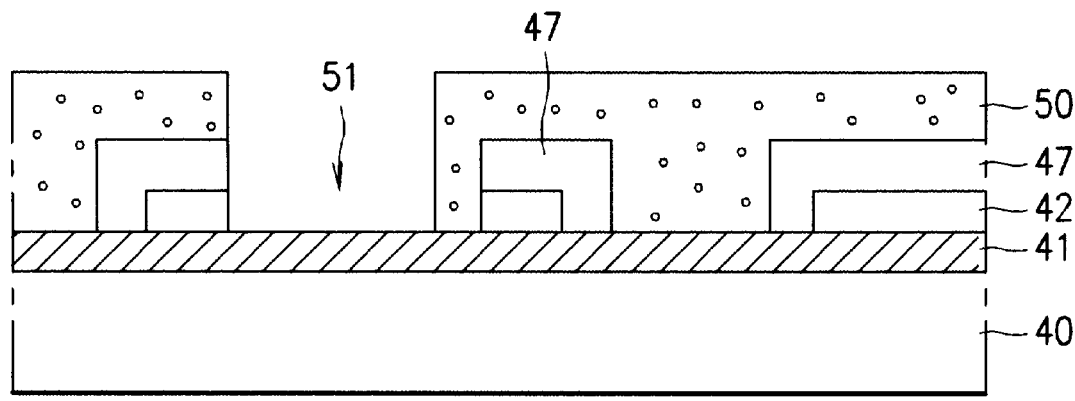

Referring to FIG. 5e, the photoresist 48 is removed. Then, a third photoresist 50 is deposited on an entire resultant surface, and the photoresist 50 on a central part of the light transmissive hole 49 is patterned to form a photoresist hole 51. A size of the photoresist hole 51 formed on the central part of the light transmissive hole 49 is formed to be the same with the size of the first opening 45. As explained before, the part of the light transmissive hole 49 region in which the photoresist hole 51 is not formed will be used as the second opening region.

Figure 5F:
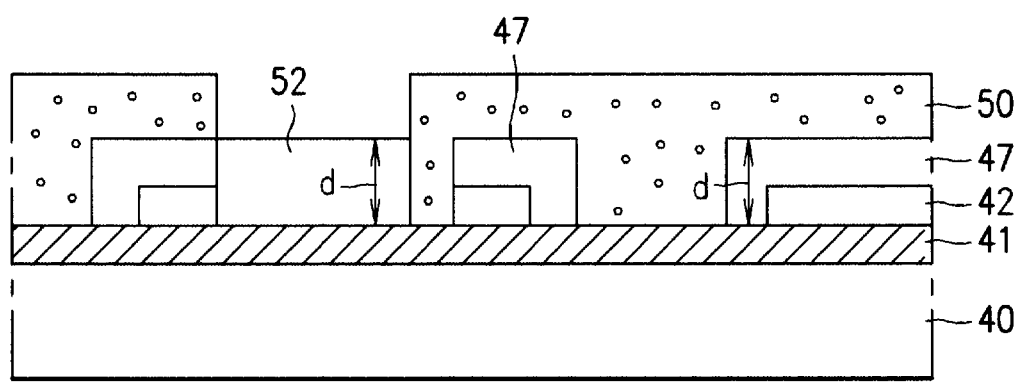

Referring to FIG. 5f, a second phase shift layer 52 is formed in the photoresist hole 51. A thickness d of the second phase shift layer 52 is formed to be the same with the thickness of the first phase shift layer 47. The second phase shift layer 52 can be formed by dissolving an oxide powder in hydrosilicofluoric acid water solution and submerging a resultant product having the photoresist hole 51 formed therein into the water solution to grow an oxide on the etch stopper layer 41 to a predetermined thickness as the second phase shift layer 52. The second phase shift layer can be also formed by sputtering an oxide in the photoresist hole 51 and carrying out a chemical mechanical polishing of the oxide to form the oxide on the etch stopper layer 41 for use as the second phase shift layer 52.

Figure 5G:
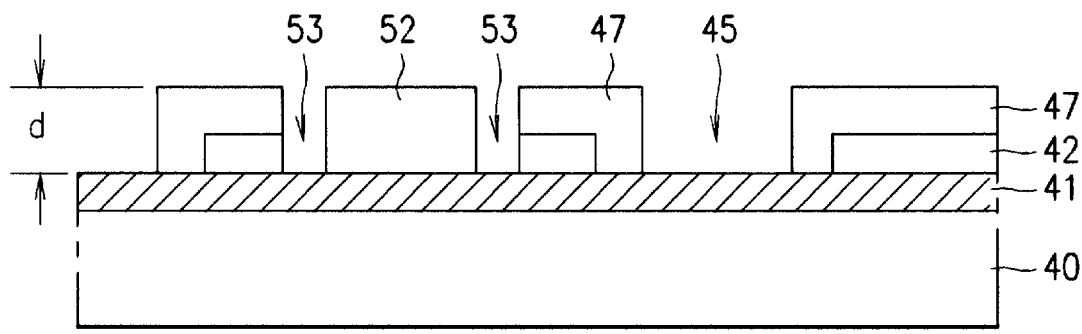

Referring to FIG. 5g, the third photoresist 50 is removed. The part of the light transmissive hole 49 from which the third photoresist 50 is removed is used as a second opening region 53, which is formed in a self alignment. The second opening region 53 constitutes a second light transmissive pattern in combination with the second phase shift layer 52.

The aforementioned phase shift mask in accordance with the present invention uses the first opening region 45 as a first light transmissive region, and the first phase shift layer 47 as a fourth light transmissive region; and the second opening region 53 is used as a second light transmissive region and the second phase shift layer 52 as a third light transmissive region. The aforementioned phase shift mask in accordance with the present invention is a phase shift mask which includes first and second light transmissive regions that transmit lights to have a phase shift of 0 degrees and third and fourth light transmissive regions that transmit lights having a phase shift of 180 degrees.

The main phase of a light passing through the first light transmissive pattern is 0 degrees of the first light transmissive region, of which the region by which an actual patterning of a photoresist is carried out is the opening region 45. The main phase of light of the second light transmissive pattern is 180 degrees of the third light transmissive region, in which the second phase shift layer 52 is formed. Since the main phases of lights passed through the first and second light transmissive patterns respectively are opposite to the other, the formation of an anomalous pattern due to the side lobes formed at a position in which the two light transmissive patterns overlap can be prevented.

The light passing through the fourth light transmissive region of the first phase shift layer 47 has a phase opposite to the phase of the first light transmissive region. The diffraction of lights between the first light transmissive region and the fourth light transmissive region cancel each other thereby allowing an accurate mask pattern.

The light passing through the second light transmissive region has a phase opposite to the phase of the third light transmissive region for the same light. The diffraction of light between the second light transmissive region and the third light transmissive region canceled by each other, thereby allowing an accurate mask pattern.

FIGS. 6a–6j illustrate the steps of a method for fabricating a phase shift mask in accordance with a second preferred embodiment of the present invention. An etch stopper layer 41, a light shielding layer 42, an oxidation preventing layer 43 and a first photoresist 44 preferably are formed on a light transmissive substrate 40 in succession. The first photoresist 44 is patterned to define a first opening region.

Figure 6A:
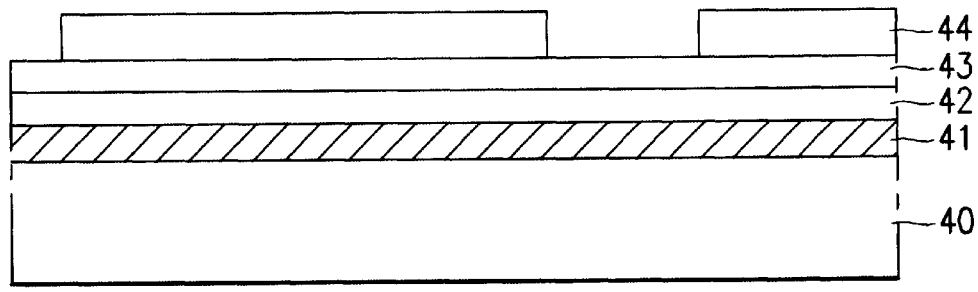
FIGS. 6a–6j illustrate sections showing the steps of a method for fabricating a phase shift mask in accordance with a preferred second embodiment of the present invention.
Figure 6B:
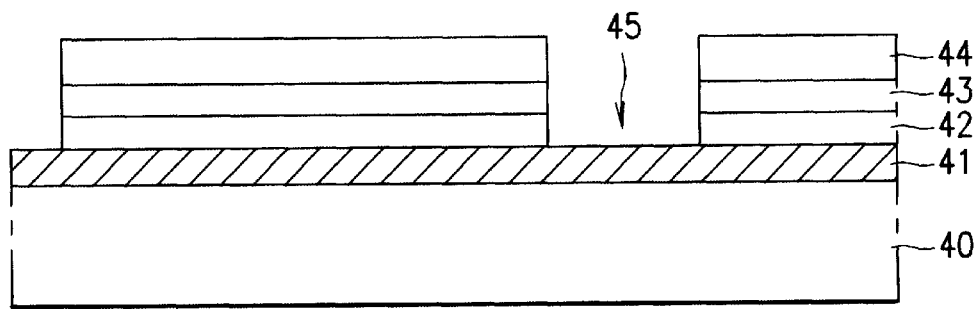

Referring to FIG. 6b, the patterned first photoresist 44 is used as a mask in selectively etching the oxidation preventing layer 43 and the light shielding layer 42 to form a first opening region 45. The first opening region 45 is used as a first light transmissive region.

Figure 6C:
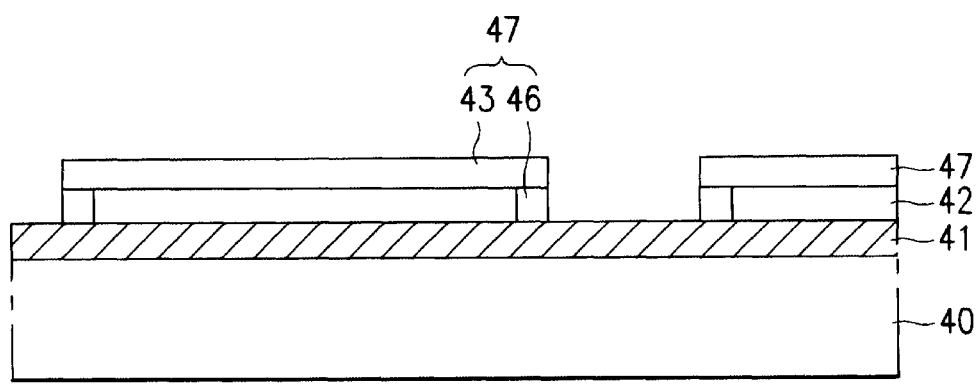

Referring to FIG. 6c, the first photoresist 44 is removed and the light shielding layer 42 exposed at sides of the first opening region 45 is thermally oxidized in an oxygen ambient. Then, a first phase shift layer 47 having the oxide 46 of the oxidized light shielding layer 42 and the oxidation preventing layer 43 on and in contact with the oxide 46 is formed in self alignment. The first phase shift layer 47 is used as a fourth light transmissive region. The first opening region 45 in combination with the first phase shift layer 47 is used as a first light transmissive pattern.

Figure 6D:
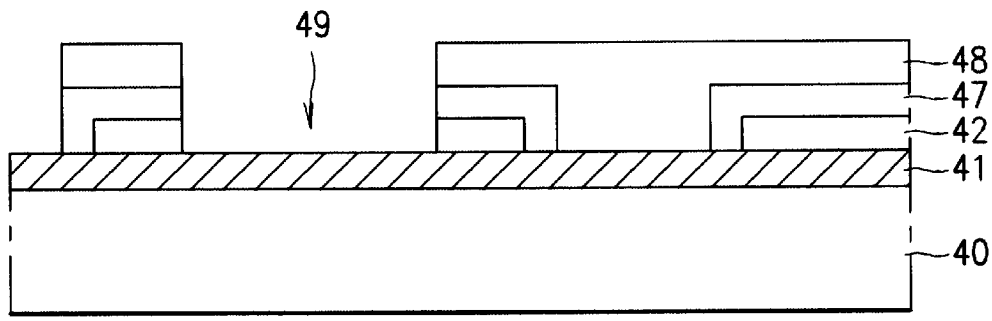

Referring to FIG. 6d, a second photoresist 48 is deposited on an entire resultant surface including the first opening region 45 and the oxidation preventing layer 43. Then, the second photoresist 48 is patterned to define a light transmissive hole to be formed. The patterned second photoresist 48 is used as a mask in preferably etching the oxidation preventing layer 43 and the light shielding layer 42 in succession to form a light transmissive hole 49. A size of the light transmissive hole 49 is formed to be the same with the size of the first phase shift layer 47 and the first opening region 45. The rim of the light transmissive hole 49 defines the edge of a second opening region.

Figure 6E:
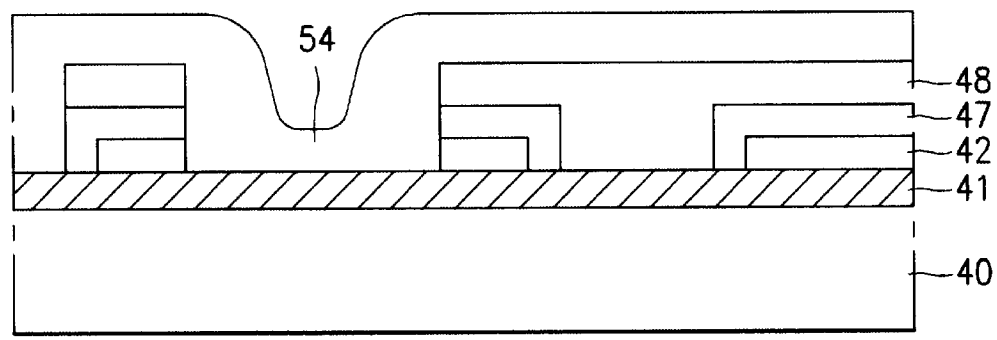
Figure 6F:
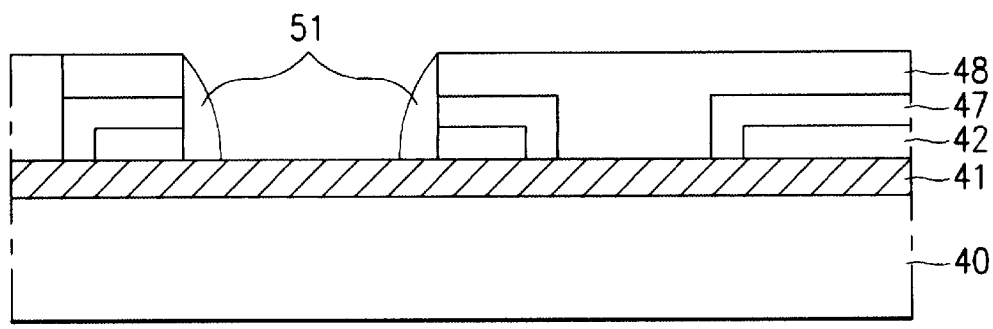

Referring to FIG. 6e, a polymer 54 is deposited on an entire resultant surface. The polymer 54 is preferably PMMA (Poly Methyl Meth Acrylate). As shown in FIG. 6f, the polymer 54 is etched back to form sidewalls 55 at the rims of the light transmissive hole 49. The sidewalls are formed so that an area occupied by the sidewalls is the same with the area of the sides of the first phase shift layer 47.

Figure 6G:
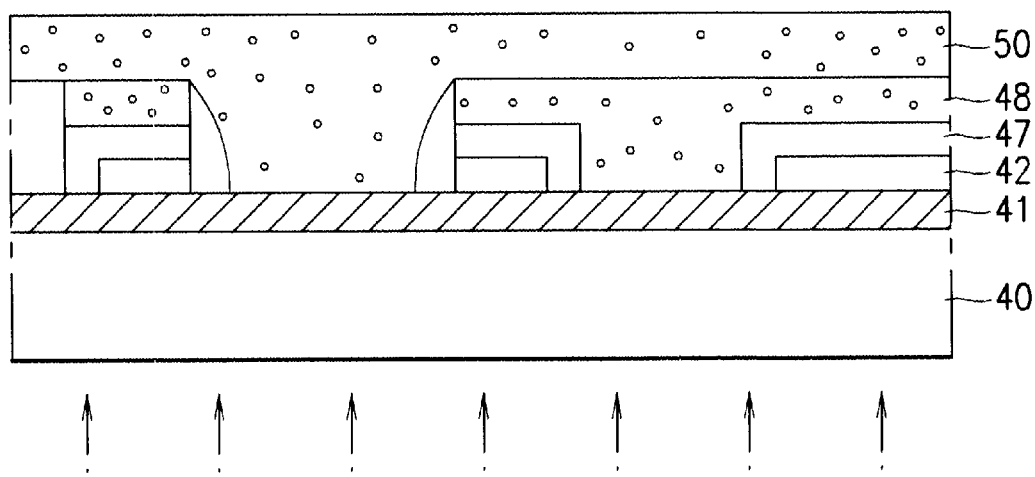
Figure 6H:
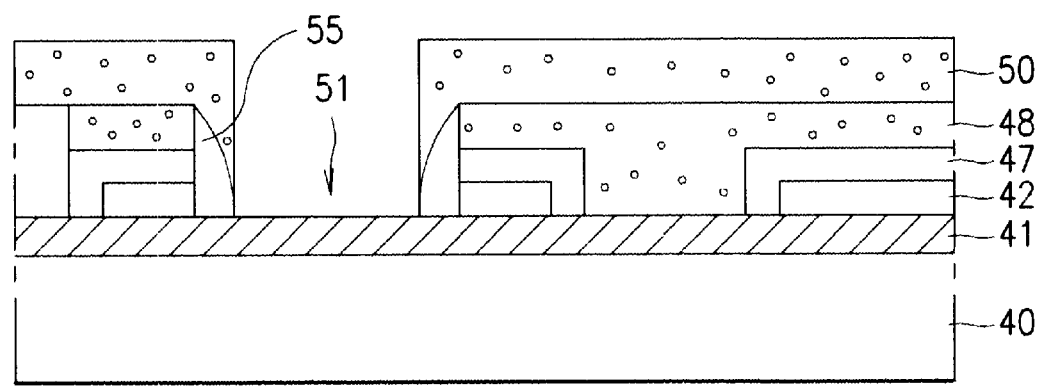

Referring to FIG. 6g, on an entire resultant surface, a third photoresist 50 is formed and exposed from the light transmissive substrate side 40, i.e., exposed from the back side. Upon development of the third photoresist 50, a photoresist hole 51 is formed between the sidewalls as shown in FIG. 6h.

Figure 6I:
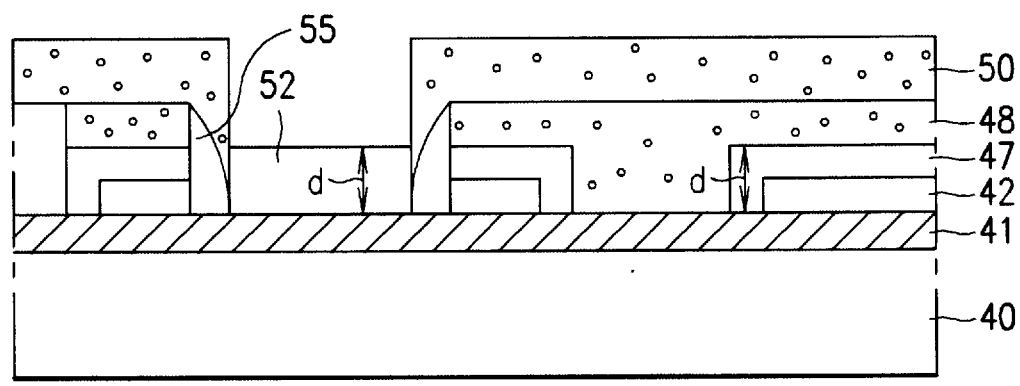

Referring to FIG. 6i, a second phase shift layer 52 is formed in the photoresist hole 51. The thickness d of the second phase shift layer 52 is formed to be the same with the thickness of the first phase shift layer 47. The second phase shift layer 52 is used as a third light transmissive region. The methods for forming the second phase shift layer 52 are the same as the first embodiment method.

Figure 6J:
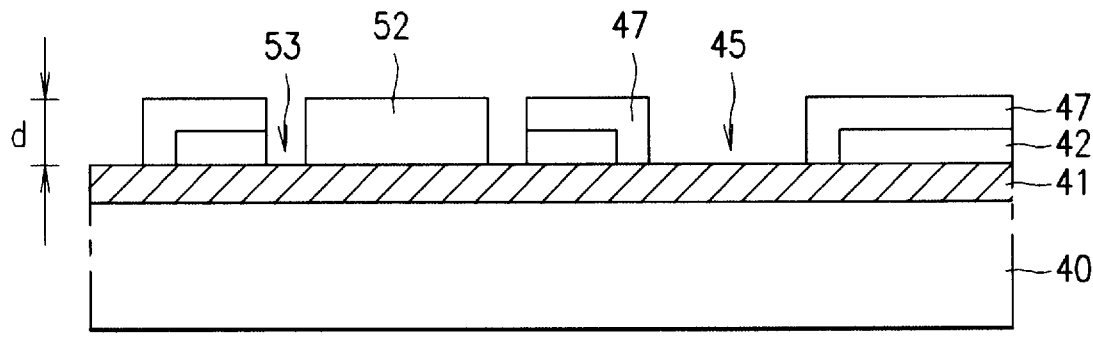

Referring to FIG. 6j, the photoresists 48 and 50 and the sidewalls 55 are removed to expose the second opening region 53, which is formed in self alignment. The second opening region 53 in combination with the second phase shift layer 52 constitutes a second light transmissive pattern. The second opening region 53 is used as the fourth light transmissive region. The operation of the phase shift mask in accordance with the second embodiment of the present invention is the same with the phase shift mask in accordance with the first embodiment.

As has been explained, the phase shift masks in accordance with the preferred embodiments of the present invention have various advantages. The formation processes of every light transmissive pattern on an etch stopper layer easily facilitate the control of an etch stopping point, and prevents damage to the light transmissive substrate, thereby improving the device reliability. The formation of the first phase shift layer, which is supplementary light transmissive pattern, and the second opening region in self alignment prevents occurrence of defects, which can be formed during the etching process due to misalignment. A symmetrical phase shift mask can be formed which allows easy and accurate control of line widths.

It will be apparent to those skilled in the art that various modifications and variations can be made to the device and method for fabricating semiconductor device of the present invention without departing from the spirit or scope of the invention. It is intended that the present invention cover the modifications and variations of this invention provided they come within the scope of the appended claims and their equivalents.

What is claimed is:

1. A phase shift mask, comprising:

an etch stopper layer formed on a substrate;

a plurality of light shielding portions formed on the etch stopper layer; and first light transmissive patterns and second light transmissive patterns formed alternately on the etch stopper layer, wherein each of the first light transmissive patterns has a first light transmissive region formed on a central part of the first light transmissive pattern and a first phase shift region formed at edge of the first light transmissive region, and wherein each of the second light transmissive patterns has a second phase shift region formed on a central part of the second light transmissive pattern and a second light transmissive region formed at edges of the second phase shift region.

2. The phase shift mask of claim 1, wherein each of the first and second phase shift regions is formed of an oxide.

3. The phase shift mask of claim 1, wherein the etch stopper layer is formed of $SnO_2$.

4. The phase shift mask of claim 1, wherein the light shielding portion are formed of a thermally oxidizable material containing Si.

5. The phase shift mask of claim 1, wherein the light shielding portions are formed of polysilicon.

6. The phase shift mask of claim 1, wherein the first and second phase shift regions have substantially the same thickness.

7. A method for fabricating a phase shift mask comprising the steps of:

providing a light transmissive substrate;

forming an etch stopper layer, a light shielding layer and an oxidation preventing layer on the light transmissive substrate;

selectively removing the oxidation preventing layer and the light shielding layer to form a plurality of first transmissive regions;

partially oxidizing portions of the light shielding layer at sides of the first transmissive regions to form first phase shift regions, wherein the first transmissive regions and first phase shift regions form a plurality of first light transmissive patterns;

selectively removing the oxidation preventing layer and the light shielding layer at locations between the first light transmissive patterns to form light transmissive holes; and forming a second phase shift region on a central part of each of the light transmissive holes such that edges of the light transmissive holes are not covered by the second phase shift regions, wherein the second phase shift regions and the edges of the light transmissive holes form second light transmissive patterns.

8. The method of claim 7, wherein the light transmissive substrate is formed of one of quartz and glass.

9. The method of claim 7, wherein the etch stopper layer is formed of $SnO_2$.

10. The method of claim 7, wherein the light shielding layer is formed of a thermally oxidizable material containing Si.

11. The method of claim 7, wherein the light shielding layer is formed of polysilicon.

12. The method of claim 7, wherein the oxidation preventing layer is formed of an oxide.

13. The method of claim 7, wherein the first phase shift regions include a portion of the oxidation preventing layer and an oxide of the light shielding layer.

14. The method of claim 7, wherein a size of an area of each of the light transmissive holes is substantially the same size as an area of each of the first light transmissive patterns.

15. The method of claim 7, wherein the second phase shift regions are formed of an oxide.

16. The method of claim 7, wherein a size of an area of each of the second phase shift regions is formed to be substantially the same size as an area of each of the first transmissive regions.

17. The method of claim 7, wherein the first and second phase shift regions have substantially the same thickness.

18. The method of claim 7, wherein a thickness of each of the first and second phase shift regions is formed to have a thickness d of approximately:

$$d = \frac{\lambda}{2(n-1)}$$

where $\lambda$ is a wavelength of light, and n is a light refractive index of the phase shift regions.

19. A method for fabricating a phase shift mask comprising the steps of:

providing a light transmissive substrate;

forming an etch stopper layer, a light shielding layer and an oxidation preventing layer on the light transmissive substrate;

selectively removing the oxidation preventing layer and the light shielding layer to form a plurality of first transmissive regions;

partially oxidizing portions of the light shielding layer at sides of each of the first transmissive regions to form first phase shift regions, wherein the first transmissive regions and the first phase shift regions comprise a plurality of first light transmissive patterns;

selectively removing the oxidation preventing layer and the light shielding layer at locations between the first light transmissive patterns to form a plurality of light transmissive holes;

depositing a photoresist on an entire surface of the substrate including the light transmissive holes;

selectively removing the photoresist from a central part of each of the light transmissive holes to form photoresist holes;

forming a second phase shift region having a predetermined depth in each of the photoresist holes; and removing the photoresist, wherein the second phase shift regions and transmissive regions at edges of the second phase shift regions form a plurality of second light transmissive patterns.

20. A method of claim 19, wherein the step of forming a second phase shift region having a predetermined depth in each of the photoresist holes includes the steps of:

dissolving an oxide powder in hydrosilicofluoric acid water solution;

submerging the light transmissive substrate having the photoresist holes formed thereon into the hydrosilicofluoric acid water solution; and growing an oxide on the etch stopper layer to a predetermined thickness as the second phase shift region.

21. The method of claim 19, wherein the step of forming a second phase shift region having a predetermined depth in each of the photoresist holes includes the steps of:

sputtering an oxide in the photoresist holes; and conducting a chemical mechanical polishing of the oxide to form the second phase shift region.

22. A method for fabricating a phase shift mask comprising the steps of:

providing a light transmissive substrate;

forming an etch stopper layer, a light shielding layer and an oxidation preventing layer on the light transmissive substrate;

selectively removing the oxidation preventing layer and the light shielding layer to form a plurality of first transmissive regions;

partially oxidizing of the light shielding layer at sides of each of the first transmissive regions to form first phase shift regions, wherein the first transmissive regions and first phase shift regions form first light transmissive patterns;

selectively removing the oxidation preventing layer and the light shielding layer at locations between the first light transmissive patterns using a first photoresist to form light transmissive holes;

forming sidewalls at sides of the photoresist, the oxidation preventing layer and the light shielding layer in each of the light transmissive holes;

depositing a second photoresist on an entire surface of the substrate including the sidewalls;

exposing the light transmissive substrate from a back thereof and developing the second photoresist to form photoresist holes;

forming a second phase shift region having a predetermined thickness in each of the photoresist holes; and removing the sidewalls, wherein the second phase shifting regions and second transmissive regions at edges of the light transmissive holes form second light transmissive patterns.

23. The method of claim 22, wherein each of the sidewalls are formed of a polymer.

24. The method of claim 23, wherein the polymer is a Poly Methyl Meth Acrylate.

25. A phase shift mask, comprising:

an electromagnetic wave transmissive substrate;

a first layer, which is electro-magnetically transmissive and made of a material different from said electro-magnetic wave transmissive substrate, formed on said electro-magnetic wave transmissive substrate;

a plurality of electro-magnetic wave shielding regions formed on said first layer; and a first electro-magnetic wave transmissive pattern formed on said first layer between adjacent electro-magnetic wave shielding regions.

26. The phase shift mask of claim 25, wherein said first layer is an etch stopper layer.

27. The phase shift mask of claim 26, wherein said etch stopper layer is made of $SiO_2$.

28. The phase shift mask of claim 25 further comprising a second electro-magnetic wave transmissive pattern formed adjacent to said first electro-magnetic wave transmissive pattern on said first layer between adjacent electro-magnetic wave shielding regions.

29. The phase shift mask of claim 28, wherein a size of an area of said first electro-magnetic wave transmissive pattern is approximately the same size as an area of said second electro-magnetic wave transmissive pattern.

30. The phase shift mask of claim 28, wherein said first electro-magnetic wave transmission pattern comprises first phase shift regions formed at edges of the adjacent electro-magnetic wave shielding regions and a first transmissive region between said first phase shift region.

31. The phase shift mask of claim 30, wherein said second electro-magnetic wave transmission pattern comprises a second phase shift region formed at a central location of an area defined by adjacent electro-magnetic wave shielding regions, and second transmissive regions defined between edges of said second phase shift region and said adjacent electro-magnetic wave shielding regions.

32. The phase shift mask of claim 31, wherein a width of said second phase shift region and said first transmissive region is approximately the same.

33. The phase shift mask of claim 31, wherein a thickness of said first and second phase shift regions are approximately the same.

34. The phase shift mask of claim 33, wherein the thickness is equal to about $\lambda/2(n-1)$, where $\lambda$ is a wavelength of electro-magnetic waves and n is a refractive index of said first and second phase shift regions.

35. The phase shift mask of claim 25, wherein said plurality of electro-magnetic wave shielding regions are made of a thermally oxidizable material.

36. The phase shift mask of claim 29, wherein said thermally oxidizable material contains silicon.

37. The phase shift mask of claim 25, wherein said first electro-magnetic wave transmission pattern comprises first phase shift regions formed at edges of the adjacent electro-magnetic wave shielding regions and a first transmissive region between said first phase shift regions.

38. The phase shift mask of claim 37, wherein electro-magnetic waves passing through said first phase shift regions are phase shifted by approximately 180 degrees.

39. The phase shift mask of claim 25, wherein said first electro-magnetic wave transmission pattern comprises a phase shift region formed at a central location of an area defined by adjacent electro-magnetic wave shielding regions, and transmissive regions defined between edges of said phase shift region and said adjacent electro-magnetic wave shielding regions.

40. The phase shift mask of claim 39, wherein electro-magnetic waves passing through said phase shift region is phase shifted by 180 degrees.

* * * * *